(12) United States Patent
Mughal

(10) Patent No.: US 8,889,462 B2
(45) Date of Patent: Nov. 18, 2014

(54) PHOTOVOLTAIC SOLAR CELLS

(75) Inventor: Humayun Akhter Mughal, Harlow (GB)

(73) Assignee: Silicon CPV PLC (GB)

( * ) Notice: Subject to any disclaimer, the term of this patent is extended or adjusted under 35 U.S.C. 154(b) by 721 days.

(21) Appl. No.: 13/128,742

(22) PCT Filed: Nov. 12, 2009

(86) PCT No.: PCT/GB2009/051528
§ 371 (c)(1),
(2), (4) Date: May 11, 2011

(87) PCT Pub. No.: WO2010/055346
PCT Pub. Date: May 20, 2010

(65) Prior Publication Data
US 2011/0214721 A1  Sep. 8, 2011

(30) Foreign Application Priority Data
Nov. 12, 2008  (GB) .................................. 0820684.9

(51) Int. Cl.
*H01L 21/00* (2006.01)
*H01L 31/18* (2006.01)
*H01L 31/0224* (2006.01)
*H01L 31/068* (2012.01)
*H01L 31/0352* (2006.01)

(52) U.S. Cl.
CPC ............. *H01L 31/1804* (2013.01); *Y02E 10/52* (2013.01); *H01L 31/022441* (2013.01); *H01L 31/0682* (2013.01); *Y02E 10/547* (2013.01); *H01L 31/03529* (2013.01)
USPC ............................................ 438/71; 257/432

(58) Field of Classification Search
CPC .................. H01L 31/022441; H01L 31/03529; H01L 31/0682; H01L 31/1804
USPC ................................. 438/57–59, 71; 257/432
See application file for complete search history.

(56) References Cited

U.S. PATENT DOCUMENTS 4,703,553 A  11/1987  Mardesich
4,838,952 A   6/1989  Dill et al.
(Continued)

FOREIGN PATENT DOCUMENTS

CH  CN201112399 Y  9/2007
JP  2007059644      3/2007
(Continued)

*Primary Examiner* — Richard Booth
(74) *Attorney, Agent, or Firm* — Renner Kenner Greive Bobak Taylor & Weber

(57) ABSTRACT

The invention provides photovoltaic concentrator solar cells and a method of forming these from a semiconductor wafer. The method has the steps of first doping the rear surface of said wafer so as to provide a first doped region. Depositing passivation layers on the front and rear surfaces. Forming a deep groove in the rear surface through the passivation layer and doping said rear surface so as to provide an oppositely doped second doped region in the deep groove. Then an opening is formed through the rear passivation layer to the first doped region; and electrical contacts are formed on the rear surface to electrically connect to the first and second doped regions.

The photovoltaic concentrator solar cell has a semiconductor wafer with a passivation layer deposited on front and rear surfaces; and a first doped region at the rear surface. It also has a p-type contact in an opening from the rear surface to contact with said first doped region; an n-type electrical contact in a deep groove extending into the wafer from the rear surface; and a second doped region, doped from with the groove after formation thereof but prior to formation of the n-type electrical contact.

21 Claims, 4 Drawing Sheets

(56) References Cited

U.S. PATENT DOCUMENTS

| | | |
|---|---|---|
| 5,053,083 A | 10/1991 | Sinton |
| 7,339,110 B1 | 3/2008 | Mulligan |

FOREIGN PATENT DOCUMENTS

| | | |
|---|---|---|
| KR | 100372343 | 3/2003 |
| KR | 100378343 | 3/2003 |
| WO | WO2005/106966 | 11/2005 |
| WO | WO2007/126441 | 11/2007 |

PHOTOVOLTAIC SOLAR CELLS

The present invention relates to photovoltaic solar cells. In particular this invention concerns rear contact concentrated photovoltaic solar cells developed using deep grooved rear contact (DGRC) technology.

The conversion of solar energy to useful forms, such as in the generation of electricity or heat capture is increasingly important due to changes in the availability of other energy sources and the environmental impact of fossil fuel combustion. Whilst the conversion of solar energy into useable forms has been possible for many years the efficiency of this process and its high cost has limited the overall effectiveness of using solar power.

Solar cells convert light directly into electricity. A typical solar cell uses semiconductors doped to create n-type and p-type regions. The absorption of sunlight causes the electrons within the cell to move to a higher energy state. Electrodes are applied to both surfaces of the semiconductor device, connecting the solar cell to an external circuit. The movement of the higher energy electrons from the solar cell to the external circuit causes the electrons to dissipate their energy in the external circuit and then return to the solar cell.

In its most common form the semiconductor is silicon in either monocrystalline or polycrystalline form with the base material being p-type and a shallow n-type layer formed on the front surface. The light exposed electrode is usually a grid to allow the maximum amount of light into the solar cell and is normally composed of silver. The back surface layer is usually a continuous metal layer, normally aluminium.

The intensity of light falling on a solar cell is known as the "number of suns", where 1 sun corresponds to standard illumination at $1\ kW/m^2$. Solar cells which operate under illumination greater than 1 sun are known as concentrators. Concentrator solar cells focus or guide the sunlight using optical elements to provide a high intensity light beam on a small solar cell. The advantage of concentrator solar cells is that they have a higher efficiency potential than 1 sun solar cells and are more cost effective. However, the efficiency benefits of concentration may be reduced by increased losses in series resistance as the current density increases with concentration and also by the increased temperature operation of the solar cell. High series resistance can cause power loss in concentrator solar cells.

One type of concentrator solar cell called the laser grooved buried contact (LGBC) cell generally comprises a front grid composed of grooves scribed by a laser into the surface. An electrode is formed by electroless plating of nickel and copper in the grooves. The advantage of having the electrode formed in the grooves is that the cell is able to handle the larger current densities produced at higher concentrations while maintaining an acceptable shading loss. The back surface comprises a continuous film of aluminium alloyed to the silicon semiconductor. As with the front surface, the back surface aluminium film is plated with nickel and copper layers to form the base electrode. The particular configuration of LGBC cells, forming a local emitter by laser grooving and groove diffusion significantly reduces series resistance.

LGBC cells provide significant benefits over more conventional types of solar cell. The LGBC solar cell structure gives a solar cell efficiency of 18% under standard test conditions, namely, when a typical groove separation distance of 1.5 mm is used with a Czochralski grown monocrystalline wafer of thickness typically 220 μm. If the groove separation distance is reduced to between 250-500 μm, the LGBC cell can be used with focussed sunlight with an intensity of up to 100 times that of normal sunlight. With a correctly designed cell an efficiency of up to 19% can be achieved with the standard process at 100 times concentration for active solar cell areas of 1 to 4 $cm^2$. As the cost of the solar cell is essentially the same as for 1 sun use this represents a major cost saving. However, at this high level of concentration a large number of grooves are present on the cell surface and the metallization in the grooves shades the surface and reduces the efficiency of the solar cell by reflecting light away from the surface. The surface shading of the active area for a typical 100 times concentrator cell is between 10%-14%.

If the solar cell can be configured so that the contacts are on the back surface, without an increase in the series resistance of the cell, then a proportionate increase in cell efficiency under concentration is possible.

A number of back contact solar cells have been developed using either screen printing or photolithography techniques, however these technologies are problematic. Screen printed cells are not suitable for use with concentrated light due to high series resistance losses. Photolithographic techniques are not cost effective and are too expensive for high volume solar cell fabrication.

It is a principal aim of the present invention to provide a photovoltaic solar cell using Deep Grooved Rear Contact (DGRC) technology, having all of the contacts on the back surface without an increase in the cell's series resistance, in order that a proportionate increase in cell efficiency under concentration may be obtained.

According to this invention, there is provided a method of forming photovoltaic concentrator solar cells from a semiconductor wafer having a front surface and a rear surface comprising the following steps:
(a) doping the rear surface of said wafer so as to provide a first doped region at the rear of said wafer;
(b) depositing passivation layers on the front and rear surface;
(c) forming deep grooves in the rear surface through the rear passivation layer;
(d) doping said rear surface so as to provide a second doped region in the deep groove, said second doped region being oppositely doped to said first doped region;
(e) forming an opening, through the rear passivation layer to the first doped region; and
(f) forming electrical contacts on said rear surface to electrically connect to the first and second doped regions.

The electrical contacts of the first and second doped regions need to be electrically isolated and this may be achieved by scribing the rear surface to isolate the opposing semiconductor type contacts.

The electrical contacts may be formed in step (f) by electroless plating. This is a standard method used in the fabrication of solar cells and may comprise one or more of the following sequence of steps:
(i) electroless nickel deposition; and/or
(ii) electroless nickel sintering; and/or
(iii) electroless copper deposition; and/or
(iv) copper surface silver passivation.

Before doping of the rear surface in step (a) the wafer may first be cleaned and the surfaces etched to remove any wafer damage. The front surface of the wafer may be textured to reduce surface reflection. Surface texturing is a standard process well known in the industry and is required to reduce reflection loss. Preferably, the surface is non-planar to enable light, if not initially absorbed by the cell, to be reflected onto another surface. In order to enable the incoming light to hit the surface several times, it is highly desirable that the cell is structured so that the front surface thereof comprises a 'random pyramid' texture.

Following any cleaning or texturing of the wafer, the rear surface is doped to produce the first doped region. The doping in step (a) may be accomplished by any suitable method but is preferably achieved by spinning a compound containing the dopant onto the rear surface of the wafer, followed by heating thereof at high temperature to allow the dopant atoms to seep into the rear surface by thermal diffusion. This process requires heating of the rear surface to at least 1000° C. The heating may be provided by a belt furnace or quartz tube furnace. Ideally, the heat is maintained for such time as required to produce a resistance of approximately 100 Ω/sq.

A passivation layer is grown on the front and back surface. This layer serves not only as an anti-reflection layer but also acts as a mask and reduces recombination velocity. The deposition of the passivation layer in step (b) can be achieved using techniques known in the industry. The passivation layers are preferably formulated to give front and rear surface recombination velocity bellow 500 cm/s.

Pulsed lasers may be used to scribe a deep groove for the rear contact. Forming of the groove in step (c) may be achieved by means of standard laser grooving techniques such as laser scribing. The deep groove may also be formed by other means such as mechanical scribing for example with a diamond blade or scribe. The groove may also be formed using jets of high pressure liquid, such as water, or laser microjets which are a combination a pulsed laser in a water jet.

To maximise solar cell efficiency the groove should be deep to come within one diffusion length of the front surface of the wafer. Ideally, a plurality of grooves is formed in step (c) and preferably the grooves are spaced less than two diffusion lengths apart. "Diffusion length" is a term well understood in the art as the distance a carrier will move before it recombines.

Following formation of the groove(s) in step (c) it is preferable that the groove(s) are cleaned to remove any wafer deposits. This may be performed by any suitable method such as etching.

The doping in step (d) provides a second doped region of opposed semiconductor type to that of the first doped region. The phrase "a second doped region in the groove" is used herein to mean that the doped region is formed at the surface of the groove, in the same way as the first doped region is formed at the rear of the wafer in step (a). The passivation layer of the rear surface acts as a mask, preventing diffusion of the second dopant therein and confining the diffusion to the grooved area only. Preferably, the groove(s) should be diffused to a junction depth to give a sheet resistance of less than 100 Ω/sq. Junction depth is a term understood within the art to mean the depth (measured from the surface) of the plane in p-n junction at which concentration of acceptors is equal to the concentration of donors.

An opening is formed in step (e) through the back surface passivation layer to allow contact with the first doped region of the rear surface. This may be achieved by any suitable method (or combination of methods) such as laser cutting, water jet cutting, mechanical scribing or by using screen printed etchant for the passivation layer. Ideally, a plurality of openings is formed in step (e).

The first doped region is of opposed semiconductor type as compared to the second doped region. The first doped region may be of opposed semiconductor type to the wafer, but ideally, the wafer and first doped region are of the same semiconductor type. The first doped region may be an $n^+$ type doped region, but preferably is a $p^{++}$ type doped region.

Ideally one wafer is used to produce a plurality of solar cells, with each solar cell comprising a plurality of grooves and openings. In this way, following performance of steps (a) to (f) the wafers may be scribed and cleaved to produce separate individual cells from the wafer.

According to a second embodiment of this invention there is provided a photovoltaic concentrator solar cell comprising:
 a semiconductor wafer having a front surface and a rear surface;
 a passivation layer deposited on said front and rear surfaces;
 a first doped region at the rear surface of the wafer;
 a p-type electrical contact formed in an opening from the rear surface and in contact with said first doped region;
 an n-type electrical contact formed in a deep groove extending into the wafer from the rear surface; and
 a second doped region, doped after formation of the deep groove from within the groove prior to deposition of the n-type electrical contact, with which region the n-type electrical contact is electrically coupled.

The concentrator solar cell preferably has a plurality of grooves and openings in the rear surface thereof, which may have electrical contacts formed therein.

The passivation layer may comprise a thin silicon oxide film of a suitable thickness, such as 10 nm. This may be followed by another suitable material such as LPCVD (low pressure chemical vapour deposition) silicon nitride. A suitable thickness of silicon nitride, in this case, would be around 80 nm. Other combinations of material such as alternating layers of amorphous silicon carbide and silicon oxide may be used. The suitable passivation layer material may be deposited on the wafer at low temperature in a PECVD (Plasma Enhanced Chemical Vapour Deposition) reactor.

The first doped region of the solar cell may be negatively doped, but it is preferred, however, that the first doped region is a $p^{++}$ type doped region. A suitable dopant source material is boron, but of course any material suitable for producing the required diffusion may be used.

It is necessary that the second doped region be of opposed semiconductor type to that of the first source material and as such the second doped region is preferably an $n^+$ type doped region. Any suitable $n^+$ type dopant material, such as phosphorus may be used to produce the second doped region. If the groove is produced by a method that includes a water jet, it is possible for the dopant to be applied to the second doped region by including it in the water of the jet.

By way of example only, two specific embodiments of photovoltaic solar cell according to the present invention as well as a method of manufacture also according to this invention will now be described in detail, reference being made to the accompanying drawings in which:—

Figure 1:
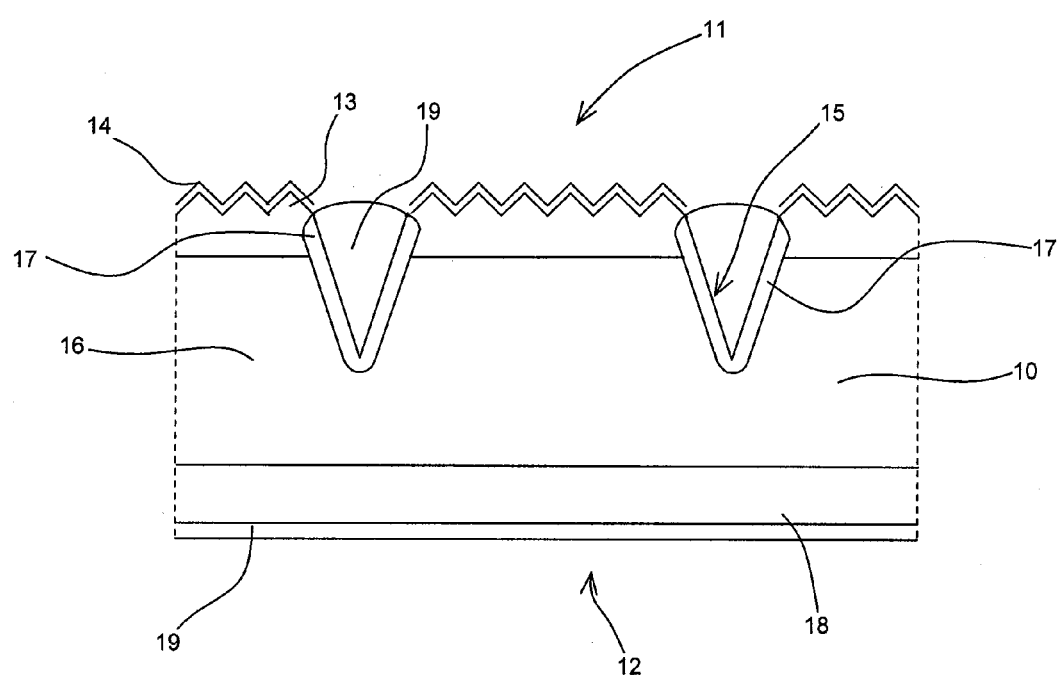
FIG. 1 illustrates a prior art LGBC solar cell.

Referring initially to FIG. 1, a section of a standard prior art front contact laser grooved buried contact solar cell is illustrated and it generally comprises a semiconductor wafer 10 having a front surface 11 and a rear surface 12. The wafer material comprises a p-type base and a shallow n-type top layer. Initially the wafer is cleaned, usually chemically and then etched to remove any damage caused by sawing of the semiconductor material. The front surface 11 is then textured to produce an array 13 of random or irregular pyramid structures. This texturing enables any light which is not initially absorbed into the cell to be "trapped" so that it is not reflected off the surface 11. The wafer 10 is doped by diffusion therein of a suitable dopant to produce a p+-type doped region 18 at the base. The front surface 11 is provided with an antireflection coating 14 such as silicon nitride to further reduce reflection. Grooves 15 are formed by means of a laser through the antireflection coating 14 into the wafer at the front surface 11. The grooves 15 are usually etched to clean any excess fragments.

The surface is again subject to diffusion to create an n+-type doped region 17. This diffusion is restricted by the nitride antireflective coating 14 to the regions that have been cut by the laser. An aluminium layer (not shown) is then evaporated onto the rear surface 12 of the wafer and then sintered. The front 11 and rear surfaces 12 are then electrolessly plated to form a nickel layer 19 followed by copper and silver which is deposited in order to form the contacts. The antireflective nitride coating 14 restricts the plating on the front surface to the grooves 15.

As illustrated in FIG. 1, the front contact of this section of the LGBC cell has two grooves 15. A number of grooves 15 are required on the cell surface 11 in order to achieve a high level of concentration. As a result, the metallization in the grooves 15 shades the surface 11 and reduces the efficiency of the solar cell by reflecting light away from the surface 11.

Figure 2A:
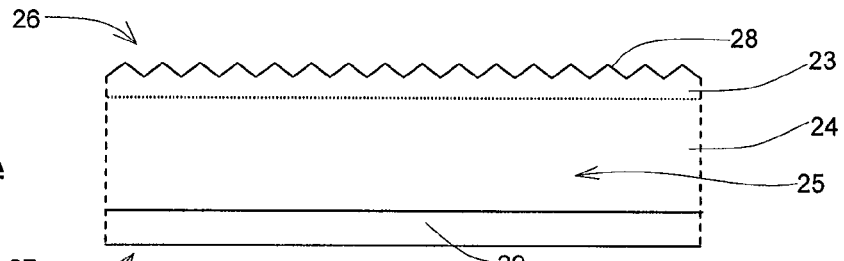
FIGS. 2A to 2F illustrate sequentially a process in accordance with the method of the present invention for making a deep grooved rear contact (DGRC) photovoltaic concentrator solar cell.
Figure 2B:
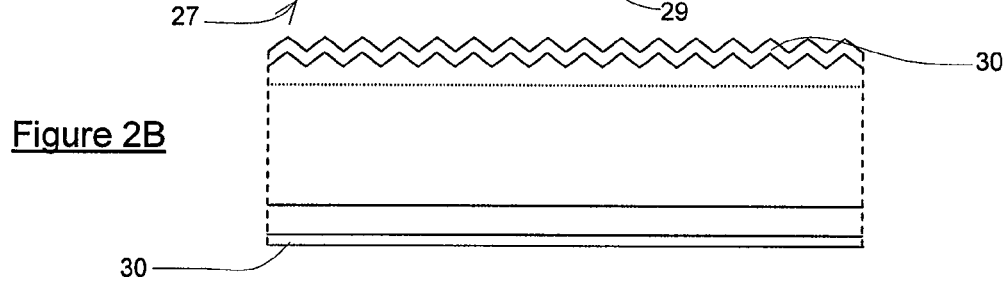
Figure 2C:
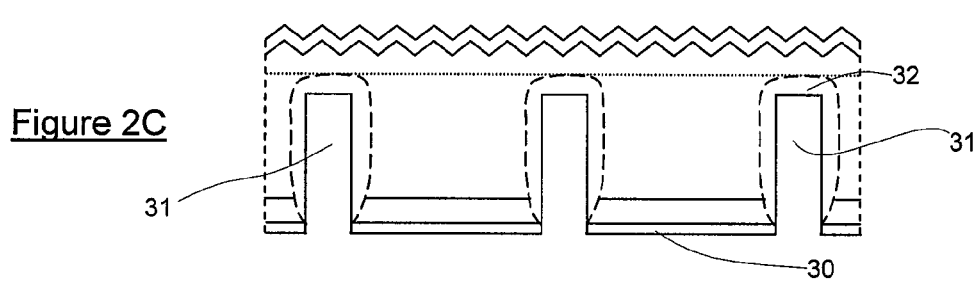
Figure 2D:
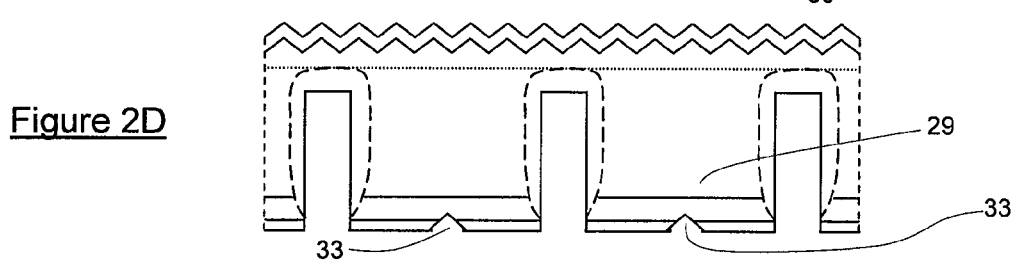
Figure 2E:
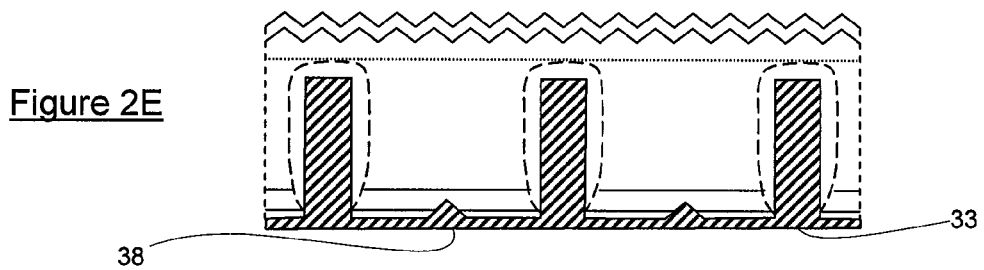
Figure 2F:
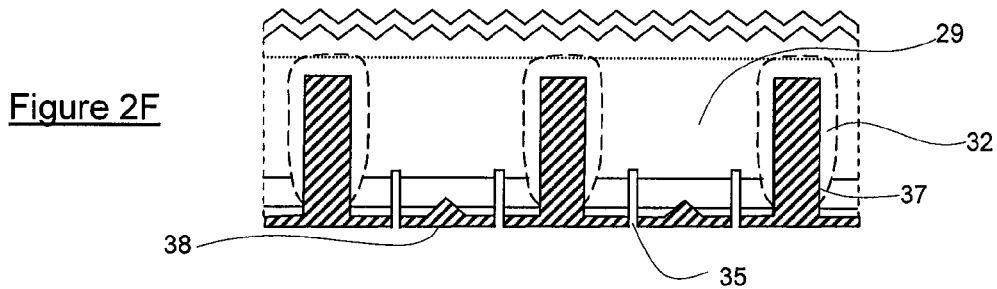
Figure 3:
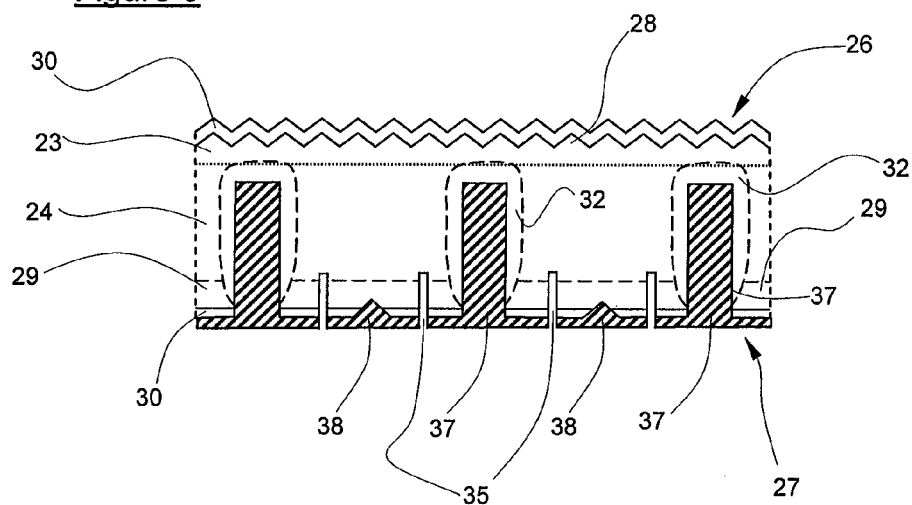
FIG. 3 illustrates a first embodiment of photovoltaic concentrator solar cell of the present invention.

FIG. 2A to 2F illustrates the sequence of steps required in order to form the DGRC photovoltaic solar cell of FIG. 3 and are in accordance with the method of the present invention. Initially, as shown in FIG. 2A the semiconductor wafer 25 is cleaned and then textured by standard methods to form a pyramid structure 28 on the front surface 26. The wafer comprises a p-type layer 24 and a shallow n-type layer 23 at the front surface. The rear surface 27 is then doped by standard methods to produce a 100 Ω/square $p^{++}$ type doped region 29. This is accomplished by spinning on a suitable dopant source material and heating to approximately 1000° C. in a belt furnace or quartz tube furnace until the desired 100 Ω/square diffusion is achieved. The dopant atoms disperse into the rear surface 27 of the wafer 25 by thermal diffusion. If the groove is produced by a method that includes a water jet, it is possible for the dopant to be applied to the second doped region by including it in the water of the jet. This can remove or reduce the need to heat the wafer, because the heat generated by the cutting can be enough to permit the introduction of the dopant from the water into the material of the wafer.

As shown in FIG. 2B passivation layers 30 are deposited on the front 26 and rear surface 27. This layer serves as an antireflection layer for the front surface 26, to prevent light being reflected away from the front surface 26. The passivation layer 30 also serves as a mask for the rear surface 27, which will be explained in more detail below. Moreover, the passivation layers 30 also serve to reduce the recombination velocity of the electrons in the solar cell and are formulated to give a front 26 and rear 27 surface recombination velocity below 500 cm/s.

Standard laser grooving or laser micro-jetting technologies using pulsed lasers are used to scribe deep laser grooves 31 in the rear surface 27, as shown in FIG. 2C, for the rear contact. As mentioned the grooves may be formed by other means. The grooves 15 are required to come within one diffusion length of the front surface 26 and adjacent grooves preferably need to be less than two diffusion lengths apart. For example, the grooves of a typical Czochralski wafer of 200 μm thickness should be approximately 150 μm deep and separated by approximately 300 μm. These grooves 31 are etched to remove any surplus wafer particles and the rear surface 27 is then doped again to produce an $n^{++}$ second doped region 32. The doping may be with phosphorus using standard techniques. The passivation layer 30 applied to the rear surface 27 acts as a mask such that during this second doping process the permeation into the wafer occurs only in the grooves 31. The diffusion into the material around the grooves 31 should be to a junction depth to give a sheet resistance of less than 10 Ω/square.

As illustrated in FIG. 2D a via 33 is then opened through the rear surface passivation layer 30 to allow contact to the p++ doped region 29 of the rear surface 27. This is achieved by laser scribing the passivation layer 30.

FIG. 2E illustrates the standard plating 34 sequence used in the standard solar cell of FIG. 1. Nickel is electrolessly deposited on the rear surface 27 and it is then sintered, followed by electroless copper deposition. Silver is then passivated on the copper surface. This process fills the vias 33 to form p-type contacts 38 and fills the grooves 31 to form the n-type contacts 37.

The rear surface 27 is then scribed or etched to form breaks 35 that isolate the electrical contacts 37 from the p-type contacts 38. This isolation scribe step is accomplished using standard technology.

The photovoltaic solar cell of the present invention formed by the method above can be seen in FIG. 3. The wafer 25 comprises a p-type layer 24 adjacent a rear surface 27 and a shallow n-type layer 23 at a front surface 26. The front surface 26 is textured to give a pyramid style structure 28 which reduces reflection of the incoming light. The rear surface 27 of the wafer 25 is doped with boron to produce a first $p^+$ doped region 29. The boron dopant seeps into the cell surface 27 by thermal diffusion. The front 26 and rear surfaces 27 have an antireflection passivation layer 30 thereon. Grooves are formed in the rear surface 27 through the passivation layer 30 and a second doped region 32 is formed around the grooves by doping with phosphorus to produce an $n^+$ doped region. The grooves 31 are filled with nickel, copper and silver to provide the n-type electrical contacts 37. P-type electrical contacts 38 are also formed from nickel, copper and silver deposited into shallow channels cut through the rear passivation layer. These contacts 37 38 are isolated from each other by breaks scribed onto the rear surface after the deposition of the metal material.

Figure 4:
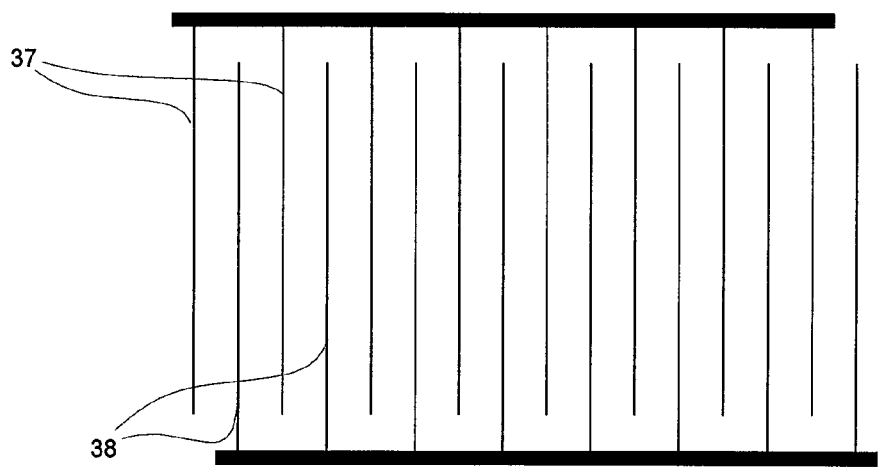
FIG. 4 illustrates a simplified view of the rear contacts of the photovoltaic concentrator solar cell of FIG. 3; and, FIG. 5 illustrates a second embodiment of photovoltaic concentrator solar cell of the present invention.

FIG. 4 illustrates a schematic representation of the rear surface 27 of the solar cell illustrated in FIG. 3. As shown, the n-type contact 37 is isolated from the p-type contact 38. The contacts of each type are linked together.

Figure 5:
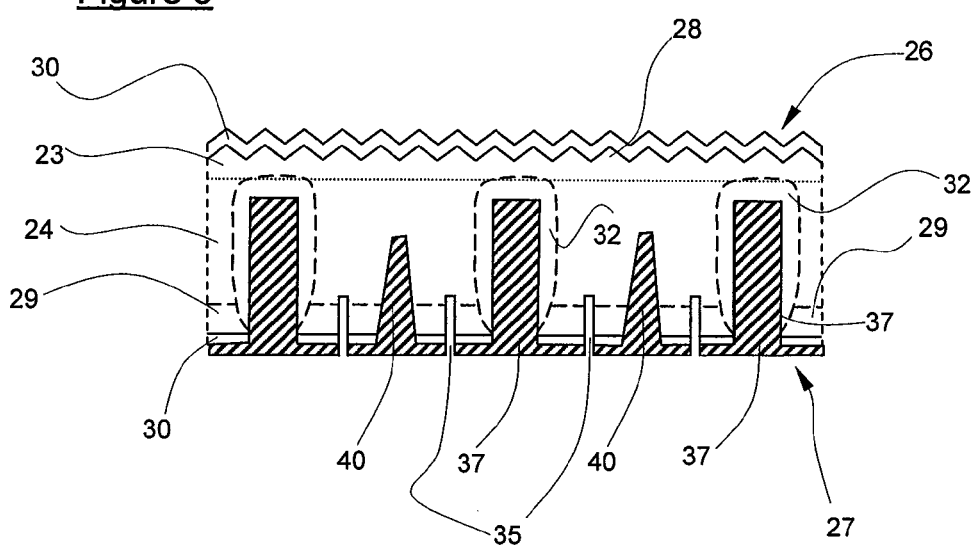

FIG. 5 shows a second embodiment of photovoltaic concentrator solar cell that is similar to that described above with like parts given like reference numerals. In this embodiment the p-type contacts 40 are much larger than those described above. The vias formed pass not only through the rear passivation layer 30 but deep into (and possible all the way through) the first $p^{++}$ doped region 29. In fact such vias are more in the form of second grooves, which like the first grooves may be further doped during or after formation. The larger area of the p-type contacts reduces the both contact and series resistance.

The invention claimed is:

1. A method of forming photovoltaic concentrator solar cells from a semiconductor wafer having a front surface and a rear surface comprising the following steps:
    (a) doping the rear surface of said wafer so as to provide a first doped region at the rear of said wafer;
    (b) depositing passivation layers on the front and rear surface to provide a dopant mask;

(c) forming a deep groove in the rear surface through the passivation layer, to within one diffusion length of the front surface of the wafer;

(d) doping said rear surface so as to provide a second doped region solely in the deep groove, said second doped region being oppositely doped to said first doped region, the passivation layers acting as a mask to confine diffusion into the wafer to the deep groove only;

(e) forming an opening, through the rear passivation layer to the first doped region; and (f) forming electrical contacts on said rear surface to electrically connect to the first and second doped regions.

2. A method as claimed in claim 1, wherein the electrical contacts of the first and second doped regions are electrically isolated by scribing the rear surface.

3. A method as claimed in claim 1, wherein the electrical contacts are formed at step (f) by electroless plating.

4. A method as claimed in claim 3, wherein the electroless plating comprises one or more of the following steps:
(i) electroless nickel deposition;
(ii) electroless nickel sintering;
(iii) electroless copper deposition; and
(iv) copper surface silver passivation.

5. A method as claimed in claim 1, wherein the doping of the rear surface in step (a) is achieved by applying a dopant source material and heating.

6. A method as claimed in claim 5, wherein the wafer is heated to approximately 1000° C.

7. A method as claimed in claim 5, wherein heating is achieved by means of a belt furnace or a quartz tube furnace.

8. A method as claimed in claim 5, wherein the heat is maintained for such time required to produce a 100 Ω/square diffusion.

9. A method as claimed in claim 1, wherein the passivation layers deposited in step (b) give a front and rear surface recombination velocity below 500 cm/s.

10. A method as claimed in claim 1, wherein a plurality of grooves are formed in the rear surface and the grooves are equally spaces from each other at less than two diffusion lengths apart.

11. A method as claimed in claim 1, wherein in step (d), diffusion of dopant into the groove is to a junction depth sufficient to provide a sheet resistance less than 10 Ω/sq.

12. A method as claimed in claim 1, wherein in step (e), the opening is formed through the rear surface by means of screen printed etching of the passivation layer.

13. A method as claimed in claim 1, wherein a plurality of elongate openings are formed through the rear surface between the grooves.

14. A method as claimed in claim 1, wherein said first doped region is of the same doping type as said wafer.

15. A method as claimed in claim 1, wherein the first doped region is a $p^+$ type doped region.

16. A photovoltaic concentrator solar cell comprising:
a semiconductor wafer having a front surface and a rear surface;
a passivation layer deposited on said front and rear surfaces, which passivation layer serves as a dopant mask, wherein the passivation layer comprises alternating layers of amorphous silicon carbide and silicon oxide;
a first doped region at the rear surface of the wafer;
a p-type electrical contact formed in an opening through the rear surface passivation layer and into the rear surface, the p-type electrical contact being in contact with said first doped region;
an n-type electrical contact formed in a deep groove extending into the wafer from the rear surface so as to be within one diffusion length of the front surface of the wafer; and
a second doped region in the deep groove, doped after formation of the deep groove from within the groove prior to deposition of the n-type electrical contact, with which region the n-type electrical contact is electrically coupled.

17. A photovoltaic concentrator solar cell as claimed in claim 16, wherein the passivation layer comprises a thin silicon oxide film.

18. A photovoltaic concentrator solar cell as claimed in claim 17, wherein the depth of the silicon oxide passivation layer is 10 nm.

19. A photovoltaic concentrator solar cell as claimed in claim 17, wherein the passivation layer further comprises a LPCVD silicon nitride film.

20. A photovoltaic concentrator solar cell as claimed in claim 16, wherein the first doped region is a $p^+$ type doped region.

21. A photovoltaic concentrator solar cell as claimed in claim 16, wherein the second doped region is an $n^+$ type doped region.

* * * * *